JUNCTION ISOLATION DIFFUSION

Filed Jan. 28, 1965 5 Sheets-Sheet 1

Richard L. Cunningham
Harold Gary Carlson
INVENTOR.

BY John D. [signature]

JUNCTION ISOLATION DIFFUSION

Filed Jan. 28, 1965 5 Sheets-Sheet 2

Richard L. Cunningham
Harold Gary Carlson
INVENTOR.

BY John G. Baker

Richard L. Cunningham
Harold Gary Carlson
INVENTOR.

BY John G. Baker

JUNCTION ISOLATION DIFFUSION

Filed Jan. 28, 1965 5 Sheets-Sheet 4

Richard L. Cunningham
Harold Gary Carlson
INVENTOR.

BY John D. Graham

Richard L. Cunningham
Harold Gary Carlson
INVENTOR.

BY 3,491,434
JUNCTION ISOLATION DIFFUSION

Richard L. Cunningham and Harold G. Carlson, Richardson, Tex., assignors to Texas Instruments Incorporated, Dallas, Tex., a corporation of Delaware Filed Jan. 28, 1965, Ser. No. 428,710
Int. Cl. B01j *17/00;* H01l *1/16*
U.S. Cl. 29—577 4 Claims

ABSTRACT OF THE DISCLOSURE

Disclosed is a method for forming planar semiconductor devices in which a region is formed at the existing intersection of a rectifying junction with the surface of the substrate by diffusing impurities through an aperture in an insulating layer on the surface of the substrate. The rectifying junction is then shifted from its original position to a new position of lower impurity concentration.

This invention relates to improved semiconductor devices, and more particularly to mesa and planar semiconductor diodes and transistors, and to methods of making the same.

It is, in some cases, preferable for the base region of a transistor to have the characteristics ordinarily exhibited by epitaxial semiconductor material, which of course can be deposited with an impurity concentration not necessarily greater than that of the substrate. The base region of a transistor must be limited in area, however, to lessen capacitance, and so since selective deposition of epitaxial material is difficult, some means must be found to effect this limiting of base area.

Conventional fabrication techniques using epitaxial deposition have the inherent problem of producing a surface-exposed junction formed by the epitaxial layer and the substrate. Likewise, the etching of a mesa after the epitaxial deposition, while producing a limited-area region, creates a new exposed junction. Such exposed junctions may result in undesirably high leakage currents and low reverse breakdown voltages.

Conventional planar fabrication techniques including a diffusion step using oxide masking, while eliminating the exposed junction, have the inherent problem that the surface area of the diffused layer has a higher concentration of impurity atoms than is desirable when the appropriate number of impurity atoms are present nearer the internal junction area. This high surface concentration also results in high leakage current and low breakdown. A planar diffusion to limit the base area of an epitaxial base transistor is not entirely satisfactory for this reason, and also because the lengthy diffusion operation required results in migration of the collector base junction.

It is therefore the principal object of this invention to provide an improved semiconductor device, such as an epitaxial-base transistor or a mesa epitaxial diode, which has a limited area but yet does not have the disadvantages of exposed junctions or of high impurity concentration regions at the surface adjacent a P-N junction, and to provide a method of fabricating such devices. Another object of the invention is to provide a planar semiconductor device, such as a transistor or diode, having a smaller surface concentration of impurity atoms adjacent the edge of the junction for a given diffusion, and to provide a method of fabricating such devices.

These and other objects of the invention will be more readily understood from the following detailed description taken in conjunction with the appended claims and attached drawings which show the process steps of the invention and the finished devices built according to the process.

In the drawings, FIGURES 1A-1G are elevational views in section illustrating the process steps according to the invention in fabricating a mesa epitaxial semiconductor diode, with FIGURE 1G showing the finished device;

Figure 1:
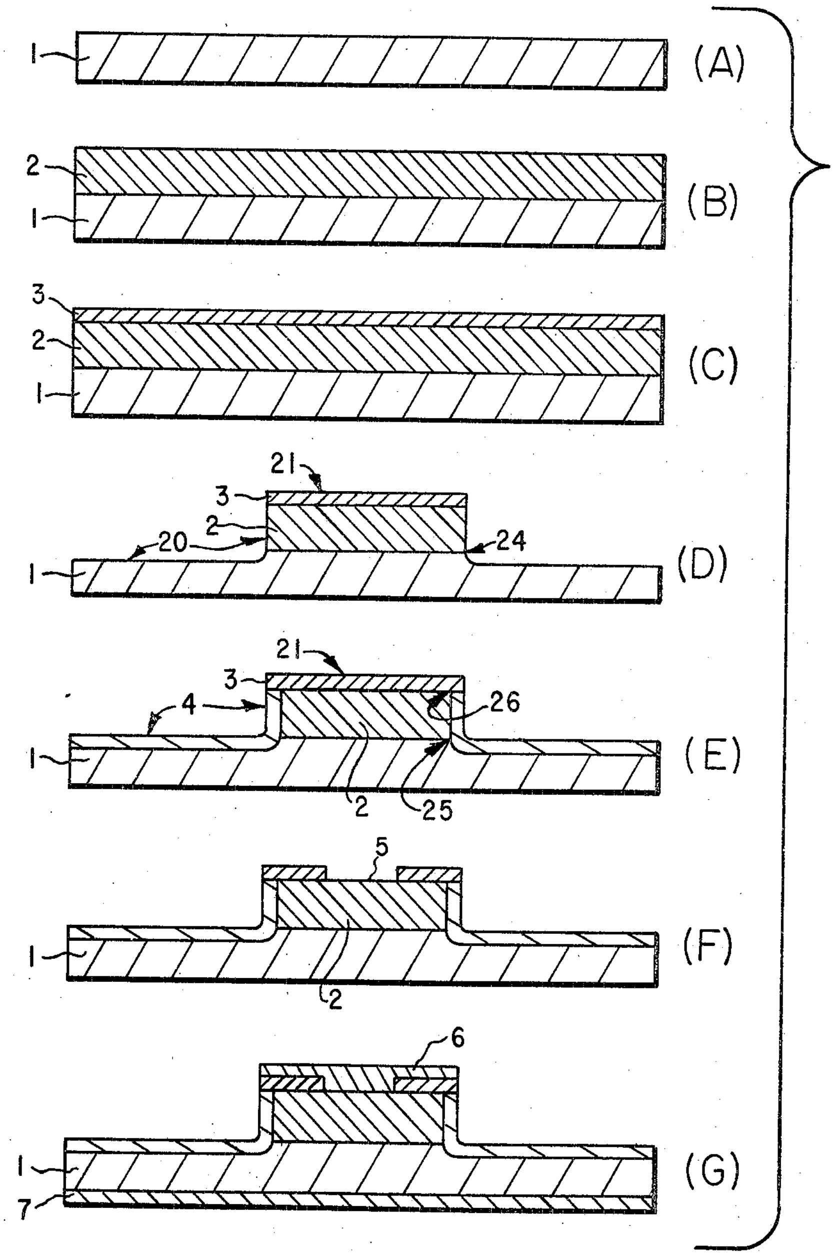

Referring now to FIGURE 1, process steps (A) to (C) inclusive show the fabrication of a diode, beginning with a semiconductor wafer 1 of one conductivity-type upon which an epitaxial layer 2 of a second conductivity-type is deposited. As an example, the wafer and epitaxial layer can be silicon, although other semiconductor materials may be used. An oxide layer 3 is formed on the top surface of the epitaxial layer 2 to act as a conventional mask during a subsequent diffusion step. A mesa is then etched to leave the top surface 21 and the lateral surface 20 with the concomitant exposed P-N junction 24 between the wafer 1 and epitaxial layer 2. A semiconductor layer 4 of the same conductivity-type as the wafer 1, is then formed by diffusing impurity material into the lateral surface 20, obliterating the exposed contaminated junction 24 and forming a P-N junction 25 in the interior of the mesa. In the same manner, the diffused layer 4 causes the lateral junction to extend from position 24 to position 26, position 26 being formed while under the protective oxide layer 21. Thus the entire newly formed P-N junction 25–26 is never exposed to the external surface of the diode. It will be noted that the regions 1 and 4 may be N-type, and the region 2 P-type, or vice versa, as desired.

It is, of course, slightly inaccurate to state that the fresh junction 25 is "formed" by the diffusion layer 4 since the junction was in existence prior to the diffusion step. The "forming" may be compared to a piece of string whose ends are clipped to expose fresh ends. Only in the case of the mesa structure, the fresh ends (junction 25, for example) are not exposed but within the body of the mesa.

By selectively removing a portion of the oxide layer 3, a window 5 is formed in the oxide layer to expose a portion of the epitaxial layer 2 to provide a means of forming a metallized contact 6. This contact may be formed by evaporation with masking, these being conventional techniques. The metallized contact 7 is evaporated onto the bottom surface of wafer 1 to complete the fabrication of the diode.

Figure 2:
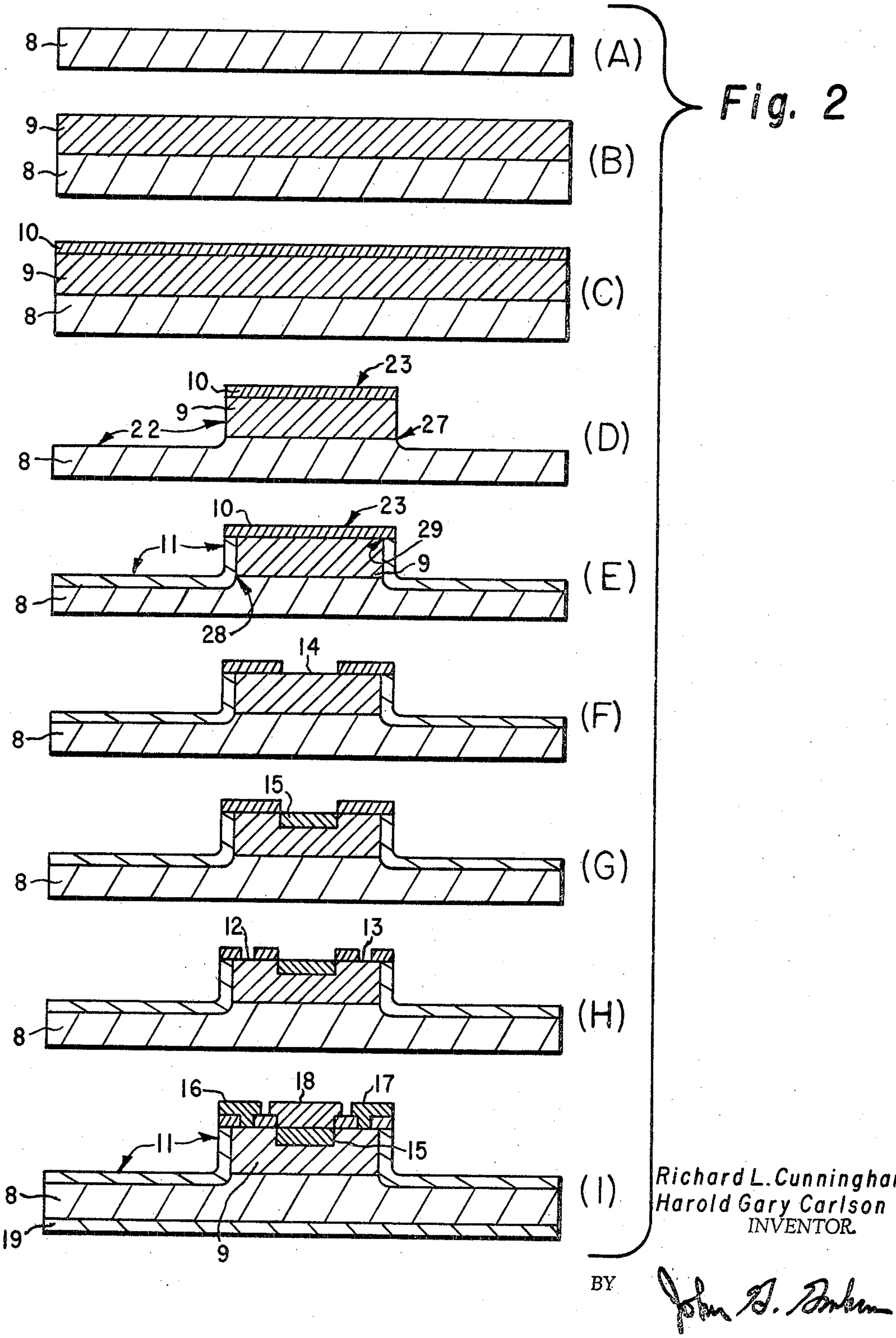
FIGURES 2A–2I are elevational views in section illustrating the process steps according to the invention in fabricating a mesa epitaxial base transistor, with FIGURE 2I showing the finished device.

FIGURE 2, having process steps (A) to (I) inclusive, shows the fabrication of a mesa epitaxial base transistor, beginning with a semiconductor wafer 8 upon which an epitaxial layer 9 is deposited. For example, the wafer 8 may be N-type silicon and the epitaxial layer P-type, although of course other semiconductor materials and/or the opposite conductivity types are applicable here as is true in any of the embodiments of the invention. An oxide layer 10, preferably silicon dioxide, is formed on the top surface of the epitaxial layer 9 to act as a conventional mask during the subsequent diffusion steps. A mesa is then etched to leave the top surface 23 and to form the lateral surface 22 with the concomitant exposed P-N junction 27 between the wafer 8 and epitaxial layer 9. A semiconductor layer 11 of the same conductivity type as the wafer 8, N-type in this example, is then formed by diffusing N-type impurity material into the lateral surface 22, erasing the exposed junction 27 as previously described in connection with the fabrication of the mesa diode of FIGURE 1 and forming the unexposed junctions 28 and 29 in the interior of the mesa transistor.

By selectively removing a portion of the oxide layer 10, a window 14 is formed therein through which an N-type semiconductor layer 15 is formed by diffusing N-type impurity material into the epitaxial layer 9 to form the emitter. Subsequently, windows 12 and 13 are selectively formed in the oxide layer 10, whereby the metallized expanded base contacts 16 and 17, respectively, are formed on and ohmically connected to the epitaxial base layer 9, which acts as the base of the transistor. Likewise, the metallized emitter contact 18 is formed on and ohmically connected to the emitter layer 15 by evaporation. The fabrication of the transistor is completed by the evaporation of a metallized collector contact 19 onto the bottom surface of the wafer 8.

Figure 3:
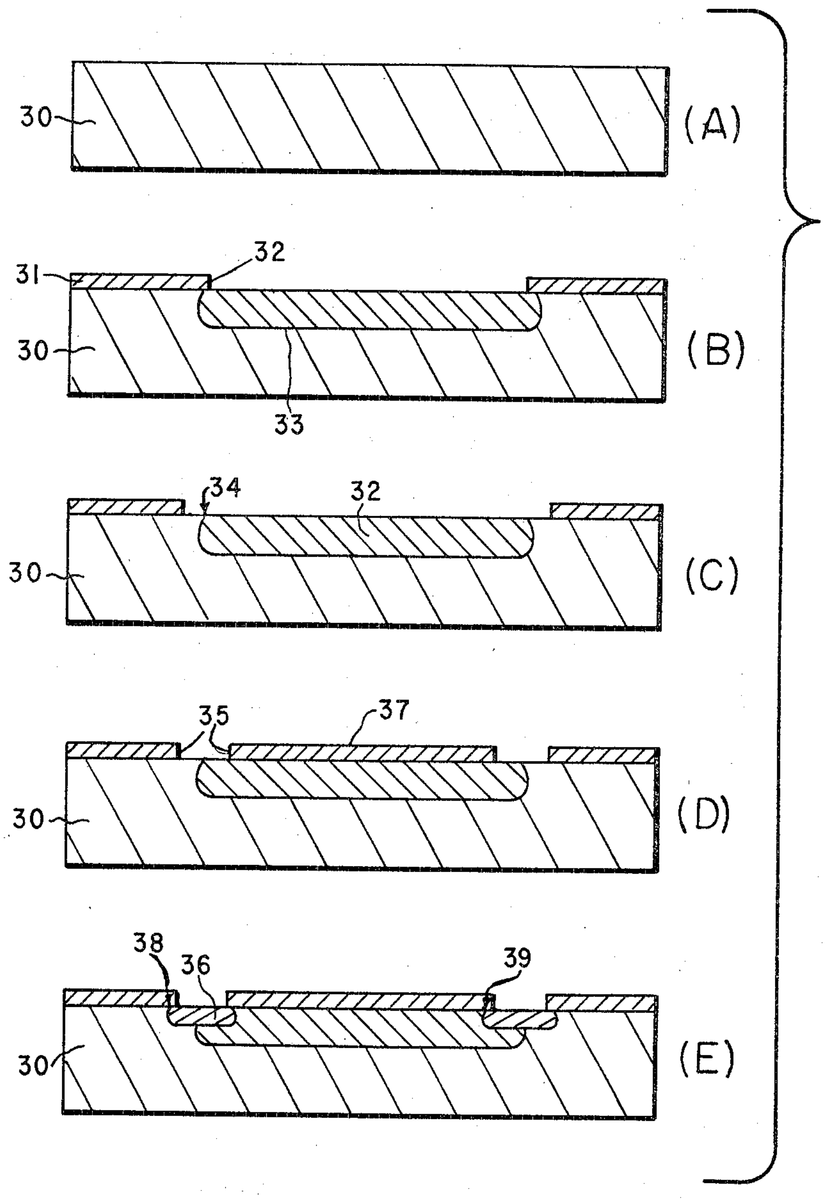
FIGURES 3A–3E are elevational views in section illustrating the process steps according to the invention in fabricating a planar semiconductor diode, with FIGURE 3E showing the finished device except for the addition of the metallized contacts by conventional methods.

Referring now to FIGURE 3, process steps (A) to (E), inclusive, show the fabrication of a planar semiconductor diode, beginning with a semiconductor wafer 30 of one conductivity type, for example N-type silicon, upon a surface of which an oxide layer 31 is formed and a portion thereof selectively removed to form a window 32 through which a semiconductor layer or region 33 of an opposite conductivity type, for example P-type is formed by diffusing P-type impurity material into the semiconductor wafer 30. With the conventional diffusion thus far described, the surface area of the diffused layer 33 inherently has a higher concentration of impurity atoms than does the internal portions of said layer. By stripping selected portions of the oxide layer 31 to bare the junction 34, shown as being annular for example, and by forming an annular center oxide layer 37, the annular window 35 is formed to permit the formation by diffusion of a semiconductor layer or region 36, which may be either P-type or N-type, for example, depending upon the junction characteristics desired and upon whether the new junction should be located at position 38 or position 39. If the wafer 30 is N-type, layer 36 is N-type, and the diffused layer 33 is P-type, then the junction is formed at position 39, whereas having layer 36 as P-type would cause the junction to be formed at position 38. The diffused layer 36 could be reasonably shallow compared to the depth of the diffused layer 33, thus causing the surface adjacent the junction to have a relatively small concentration of impurity atoms compared to the surface concentration which existed near the junction between wafer 30 and layer 33 as it existed in FIGURE 3(B). With the junction at the position 38 or 39, it is seen that higher breakdown will result because the surface concentration adjacent the junction will be low.

Figure 4:
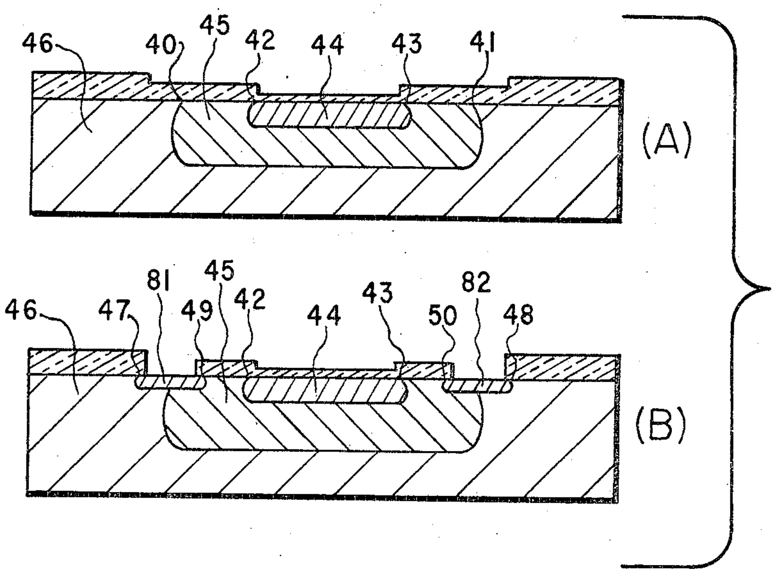
FIGURES 4A and 4B are elevational views in section illustrating the process steps according to the invention in fabricating a planar transistor.

FIGURE 4, having process steps A and B, shows the partial fabrication of a planar transistor, the previous steps of fabrication being conventional and well known in the art. A layer or region 45 of one conductivity type semiconductor material is formed by diffusing into the substrate 46 impurity material of opposite type. The semiconductor substrate 46 may be either germanium or silicon, or the III–V compounds. If germanium is used, the masking material may be pyrolytically deposited $SiO_2$. For silicon, the $SiO_2$ mask may be thermally grown. A layer or region 44 of semiconductor material of said opposite type is formed by diffusing impurity material of said opposite type into layer 45, thus creating the planar transistor as shown in FIGURE 4A, with the collector-base junction 40 and 41 and the emitter-base junction 42 and 43. In process step B an annular layer or region of semiconductor material 81 and 82 is then formed by diffusing impurity material into the collector-base junction 40 and 41 to effectively erase the intersection of the old junction 40 and 41 with the substrate surface and form a new junction portion 47 and 48 or 49 and 50, depending upon whether semiconductor layer 81 and 82 is N-type or P-type and upon the conductivity type of the other regions. If for example layer 45 is N-type, layer 46 is P-type, and layer 81 and 82 is P-type, the surfacing collector-base junction would be at locations 49 and 50, whereas if layer 81 and 82 is N-type, the surfacing collector-base junction would be at locations 47 and 48, the preferred embodiment for lowering breakdown voltage. Thus it is possible to move the new surface intersection of the collector-base junction in either direction, that is, towards or away from the emitter-base junction 42 and 43 by controlling the conductivity-type of the diffused layer 81 and 82. The shallow-diffused layer 81 and 82 also makes possible a lower surface concentration of impurity atoms because it is more shallow than the diffused region 45. Of course if it should be so desired, diffused layer 81 and 82 could be more heavily doped with impurity atoms than the diffused region 45 to provide a higher surface concentration.

Figure 5:
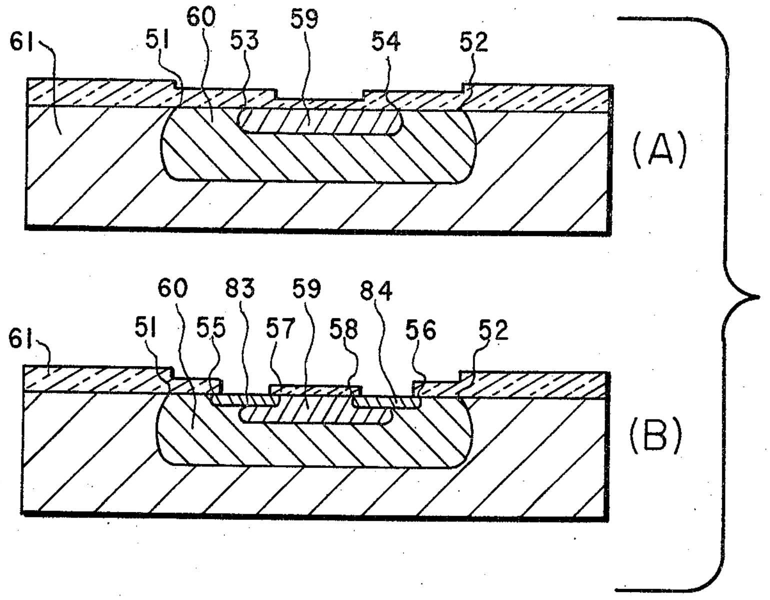
FIGURES 5A and 5B are elevational views in section illustrating another embodiment of the process steps according to the invention in fabricating a planar transistor.

FIGURE 5, having process steps A and B, show the partial fabrication of a planar transistor, the previous steps of the fabrication being conventional and well known in the art. Process step A is identical to process step A of FIGURE 4, having a semiconductor layer 60 of one type formed by diffusing impurity material of one type into the semiconductor substrate 61 of opposite type. A semiconductor layer 59 of the opposite type is formed by diffusing impurity material of the opposite type into layer 60, thus creating the planar transistor, with the collector-base junction 51 and 42 and the emitter base junction 53 and 54. An annular semiconductor layer 83 and 84 is then formed by diffusing impurity material into the emitter-base junctions 53 and 54. The layer 83 and 84 may be either N-type or P-type, for example, depending upon whether it is desired that the new emitter-base junction be located at positions 57 and 58 or at positions 55 and 56. If layer 59 is P-type and layer 60 is N-type, a diffused layer 83 and 84 of N-type would cause the emitter-base junction to be located at positions 57 and 58, whereas if layer 83 and 84 is P-type, the emitter-base junction will be located at positions 55 and 56. Thus it is possible to move the new emitter-base junction in either direction, that is, towards or away from the collector-base junctions 51 and 52 by controlling the conductivity-type of the diffused layer 83 and 84. The shallow-diffused layer 83 and 84 makes it possible to control the surface concentration of impurity atoms regardless of the impurity doping level and diffusion depth in the diffused region 59, since the impurity level and depth of the layer 83 and 84 are substantially independent of the impurity level and depth of the diffused region 59.

Figure 6:
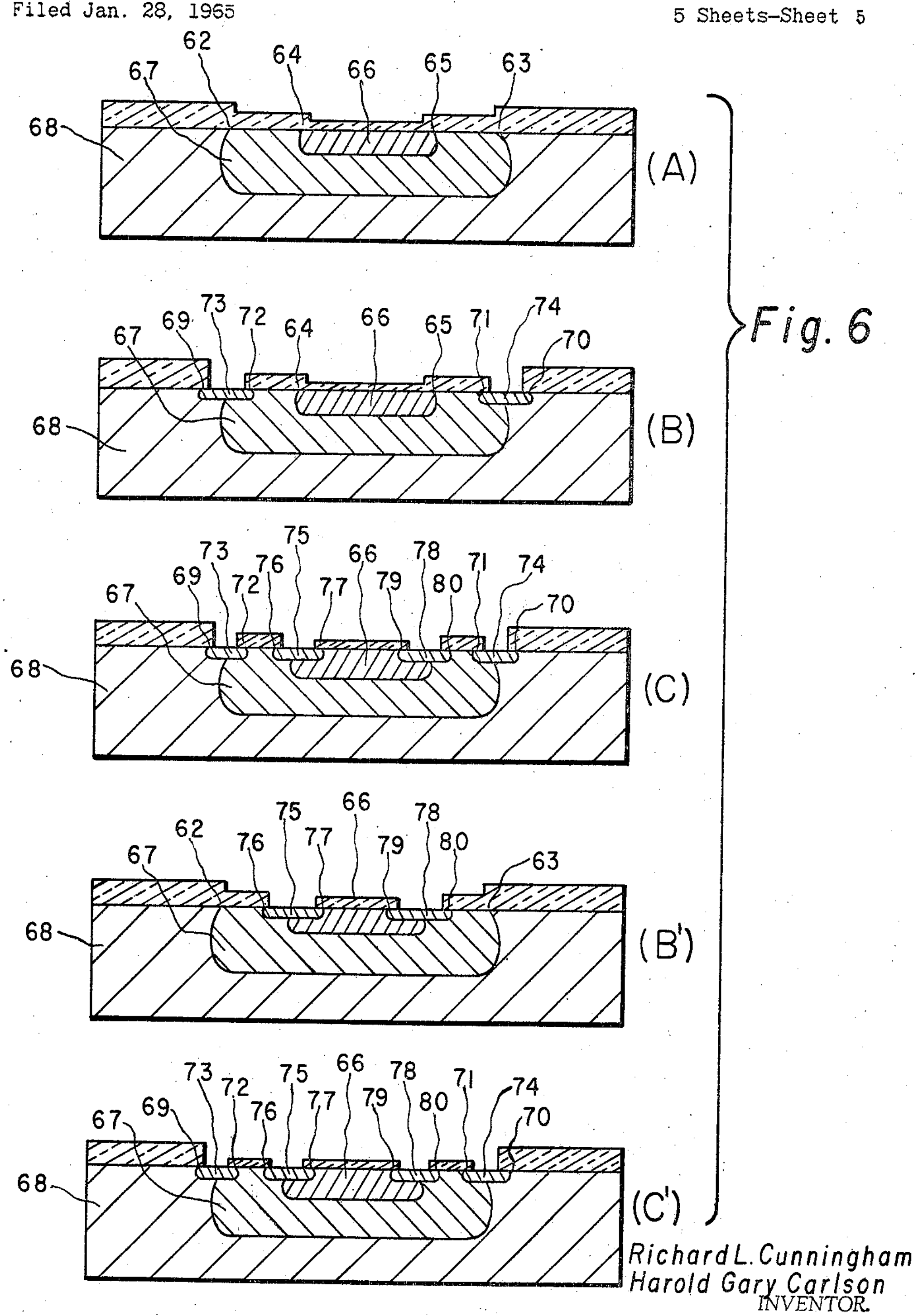
FIGURES 6A, 6B, 6C, 6B′ and 6C′ are elevational views in section illustrating still another embodiment of the process steps according to the invention in fabricating a planar transistor.

FIGURE 6, with process steps A, B and C, and the alternate steps A, B′ and C′ illustrates what is substantially a combination of FIGURES 4 and 5. The steps A, B and C illustrate a planar transistor having a collector substrate 68, a diffused base region 67 and a diffused emitter region 66. For example, the collector 68 could be P-type, the base 67 N-type, and the emitter 66 P-type. The semiconductor material could be silicon, germanium or other suitable material. Furthermore, steps A, B and C illustrate the formation first of a semiconductor layer 73 and 74 by diffusing impurity material into the collector-base junctions 62 and 63, and then the formation of a semiconductor layer 75 and 78 by diffusing impurity material into the emitter base junctions 64 and 65 while process steps A, B′ and C′ show the formation of semiconductor layer 75 and 78 by diffusing impurity material into the emitter-base junctions 64 and 65 and then the formation of semiconductor layer 73 and 74 by diffusing impurity material into the collector-base junctions 62 and 63. Whether the process steps A, B and C or A, B′ and C′ are followed, the device as shown in C and C′ are substantially the same and have similar characteristics. If the layer 75 and 78 is P-type, the surfacing emitter-base junctions will be at locations 77 and 79, whereas if the layer 75 and 78 is N-type, the surfacing emitter-base junction will be at locations 76 and 80. If the layer 73 and 74 is P-type, the surfacing collector-base junction will be at locations 69 and 70, whereas if the layer 73 and 74 is N-type, the surfacing collector-base junction will be at locations 71 and 72. Thus the emitter-base junction and the collector-base junction may be individually moved on the lateral surfaces of the device, either closed together or further apart. Also, any portion of the surface impurity concentration may be controlled to give a higher or lower surface concentration of impurity atoms substantially independent of the surface concentration or depth of the diffused regions 67 and 66.

Although the present invention has been shown and described with reference to preferred embodiments, changes and modifications will occur to those skilled in the art, such as substituting P-type material for N-type material and vice versa, or substituting germanium material for silicon material and vice versa, which do not depart from the teaching of the invention. Such changes and modifications are deemed to be within the scope and spirit of the invention as defined in the appended claims.

What is claimed is:

1. A method of fabricating a planar transistor, comprising the steps of:

(a) selectively diffusing impurity material of one conductivity-type into one surface of a semiconductor wafer of opposite conductivity-type to form a base region of said one conductivity-type, whereby a collector-base junction is formed between said base region and said wafer, said collector-base junction intersecting said one surface, (b) selectively diffusing impurity material of said opposite conductivity-type into said base region to form an emitter region of said opposite conductivity-type, whereby a base-emitter junction is formed between said base region and said emitter region, said base-emitter junction intersecting said one surface, (c) selectively diffusing impurity material of said one conductivity-type into the collector-base junction to form a third region of said one conductivity-type, whereby a new surface intersection of the collector-base junction is formed between said third region and said wafer, and (d) diffusing impurity material of said one conductivity-type into said base-emitter junction to form a fourth region of said one conductivity-type, whereby a new surface intersection of the base-emitter junction is formed between said fourth region and said emitter region.

2. A method of fabricating a planar transistor, comprising the steps of:

(a) selectively diffusing impurity material of one conductivity-type into one surface of a semiconductor wafer of opposite conductivity-type to form a base region of one conductivity-type, whereby a collector base junction is formed between said base region and said wafer, said collector-base junction intersecting said one surface, (b) selectively diffusing impurity material of said opposite conductivity type into said base region to form an emitter region of said opposite conductivity-type, whereby a base-emitter junction is formed between said base region and said emitter region, said base-emitter junction intersecting said one surface, (c) selectively diffusing impurity materials of said opposite conductivity-type into the collector-base junction to form a third region of said opposite conductivity-type, whereby a new surface intersection of the collector-base junction is formed between said third region and said base region, and (d) diffusing impurity materials of said one conductivity-type into said base-emitter junction to form a fourth region of said one conductivity type, whereby a new surface intersection of the base-emitter junction is formed between said fourth region and said emitter region.

3. A method of fabricating a planar transistor, comprising of the steps of:

(a) selectively diffusing impurity material of one conductivity-type into one surface of a semiconductor wafer of opposite conductivity-type to form a base region of one conductivity-type, whereby a collector-base junction is formed between said base region and said wafer, said collector-base junction intersecting said one surface, (b) selectively diffusing impurity material of said opposite conductivity type into said base region to form an emitter region of said opposite conductivity-type, whereby a base-emitter junction is formed between said base region and said emitter region, said base-emitter junction intersecting said one surface, (c) selectively diffusing impurity materials of said one conductivity-type into the collector-base junction to form a third region of said one conductivity-type, whereby a new surface intersection of the collector-base junction is formed between said third region and said wafer, and (d) diffusing impurity materials of said opposite conductivity-type into said base-emitter junction to form a fourth region of opposite conductivity type whereby a new surface intersection of the base-emitter junction is formed between said fourth region and said base region.

4. A method of fabricating a planar transistor, comprising the steps of:

(a) selectively diffusing impurity material of one conductivity type into one surface of a semiconductor wafer of opposite conductivity-type to form a base region of one conductivity-type, whereby a collector-base junction is formed between said base region and said wafer, said collector-base junction intersecting said one surface, (b) selectively diffusing impurity material of said opposite conductivity-type into said base region to form an emitter region of said opposite conductivity-type, whereby a base-emitter junction is formed between said base region and said emitter region, said base-emitter junction intersecting said one surface, (c) selectively diffusing impurity materials of said opposite conductivity-type into the collector-base junction to form a third region of said opposite conductivity-type, whereby a new surface intersection of the collector-base junction is formed between said third region and said base region, and (d) diffusing impurity materials of said opposite conductivity-type into said base-emitter junction to form a fourth region of said opposite conductivity-type, whereby a new surface intersection of the base-emitter junction is formed between said fourth region and said base region.

References Cited

UNITED STATES PATENTS

| | | | |
|---|---|---|---|
| 2,654,059 | 9/1953 | Shockley. | |
| 2,980,830 | 4/1961 | Shockley. | |
| 2,994,811 | 8/1961 | Senitzky | 29—25.3 XR |
| 3,146,135 | 8/1964 | Chih-Tang San. | |
| 3,183,128 | 5/1965 | Leistiko | 148—186 |
| 3,183,129 | 5/1965 | Tripp | 148—186 |
| 3,237,062 | 2/1966 | Murphy | 317—234 |
| 3,261,727 | 7/1966 | Dehmelt | 29—25.3 XR |
| 3,226,614 | 12/1965 | Haenichen | 317—234 |

PAUL M. COHEN, Primary Examiner

U.S. Cl. X.R.

29—571, 578; 148—175, 186, 189; 317—235